(12) United States Patent
Degeilh et al.

(10) Patent No.: US 10,658,283 B2
(45) Date of Patent: May 19, 2020

(54) METHOD FOR MANUFACTURING A DEVICE WITH INTEGRATED-CIRCUIT CHIP BY DIRECT DEPOSIT OF CONDUCTIVE MATERIAL

(71) Applicant: GEMALTO SA, Meudon (FR)

(72) Inventors: Line Degeilh, Gemenos (FR); Remy Janvrin, Gemenos (FR); Lucile Dossetto, Gemenos (FR); Alain Le Loc'h, Gemenos (FR); Jean-Christophe Fidalgo, Gemenos (FR)

(73) Assignee: THALES DIS FRANCE SA, Meudon (FR)

( * ) Notice: Subject to any disclaimer, the term of this patent is extended or adjusted under 35 U.S.C. 154(b) by 0 days.

(21) Appl. No.: 15/773,673

(22) PCT Filed: Oct. 28, 2016

(86) PCT No.: PCT/EP2016/076159
§ 371 (c)(1),
(2) Date: May 4, 2018

(87) PCT Pub. No.: WO2017/076780
PCT Pub. Date: May 11, 2017

(65) Prior Publication Data
US 2018/0323139 A1  Nov. 8, 2018

(30) Foreign Application Priority Data
Nov. 5, 2015 (EP) .................... 15306756

(51) Int. Cl.
*H01L 21/00* (2006.01)
*H01L 23/498* (2006.01)
(Continued)

(52) U.S. Cl.
CPC .... *H01L 23/49855* (2013.01); *G06K 19/0723* (2013.01); *H01L 21/4867* (2013.01); *G06K 19/00* (2013.01); *H01L 2224/49171* (2013.01)

(58) Field of Classification Search
CPC . H01L 21/4867; H01L 21/00; H01L 21/4846; H01L 23/49855; H01L 23/2337;
(Continued)

(56) References Cited

U.S. PATENT DOCUMENTS 7,613,907 B2 * 11/2009 Kaabouch ............... G06F 21/52
  712/220
7,816,780 B2 * 10/2010 Kajiwara ............. H01L 21/563
  257/692
(Continued)

FOREIGN PATENT DOCUMENTS

DE  102 23 865 A1  12/2003
EP  0 969 410  *  1/2010 ........... G06K 19/077
(Continued)

OTHER PUBLICATIONS

Bohandy et al., "Metal deposition from a supported metal film using an excimer laser", 1986, J. Appl. Phys. , vol. 60, No. 4, pp. 1538-1539 (Aug. 15, 1986).*
(Continued)

*Primary Examiner* — Nikolay K Yushin
(74) *Attorney, Agent, or Firm* — Buchanan Ingersoll & Rooney PC

(57) ABSTRACT

The invention relates to a method for manufacturing a device with a secure integrated-circuit chip, said device having an insulating substrate, electrically conductive surfaces on the substrate, which surfaces are connected or coupled to said electronic chip, said electrically conductive surfaces being produced by a step of depositing or transferring conductive material; the method is characterised in that
(Continued)

said step of depositing or transferring conductive material is carried out by a technique of directly depositing metal microparticles, which are free of polymer or solvent, onto the substrate, said deposit being obtained by coalescence of the microparticles forming at least one or more uniform cohesive layers that rest directly in contact with the substrate. The invention also relates to the device obtained.

20 Claims, 5 Drawing Sheets

(51) Int. Cl.
  *H01L 21/48* (2006.01)
  *G06K 19/07* (2006.01)
  *G06K 19/00* (2006.01)
(58) Field of Classification Search
  CPC ............ H01L 23/3121; H01L 23/3735; H01L 23/49811; H01L 2224/49171; H01L 2224/00; H01L 2224/73265; H01L 2224/32245; G06K 19/0723; G06K 19/00; G06K 19/077429; G06K 19/0777
  See application file for complete search history.

(56) References Cited

U.S. PATENT DOCUMENTS

| | | | |
|---|---|---|---|
| 9,355,984 B2* | 5/2016 | Escher-Poeppel | ...... H01L 24/29 |
| 2001/0050846 A1 | 12/2001 | Cho | |
| 2003/0227528 A1 | 12/2003 | Hohberger et al. | |
| 2008/0040593 A1* | 2/2008 | Kaabouch | ............... G06F 21/52 712/244 |
| 2008/0145607 A1* | 6/2008 | Kajiwara | ............... H01L 21/563 428/137 |
| 2015/0021792 A1* | 1/2015 | Escher-Poeppel | .... H01L 24/743 257/784 |
| 2015/0155152 A1* | 6/2015 | Yamazoe | ............... H01J 49/164 250/288 |

FOREIGN PATENT DOCUMENTS

| | | |
|---|---|---|
| EP | 2 840 530 A1 | 2/2015 |
| WO | WO 2012/127135 A1 | 9/2012 |
| WO | WO 2015/024821 A1 | 2/2015 |

OTHER PUBLICATIONS

PlasmaTreat (https://www.agaria.se/wp-content/uploads/2014/09/AIDE52_05-Fine-Powder-Coating.pdf). Dec. 2014.*

DuPont™ Elvax® EVA data (at https://www.dow.com/en-us/insights-and-innovation/product-news/elvax-eva-industrial-consumer-grades Dec. 2003 (Year: 2003).*

International Search Report (PCT/ISA/210) dated Jan. 26, 2017, by the European Patent Office as the International Searching Authority for International Application No. PCT/EP2016/076159.

Written Opinion (PCT/ISA/237) dated Jan. 26, 2017, by the European Patent Office as the International Searching Authority for International Application No. PCT/EP2016/076159.

* cited by examiner

METHOD FOR MANUFACTURING A DEVICE WITH INTEGRATED-CIRCUIT CHIP BY DIRECT DEPOSIT OF CONDUCTIVE MATERIAL

FIELD OF THE INVENTION

The invention relates to a method of manufacturing a device with an integrated-circuit chip comprising a step of directly depositing conductive material as well as to the device obtained.

The devices preferably referred to belong to the technical field of devices whose integrated-circuit chip is secured in particular by its structure or security means implemented during operation. Such secure devices are found among others in the smart card industry.

The invention also relates to a method of manufacturing a device with an integrated-circuit chip having an insulating substrate, electrically conductive surfaces on the substrate that are connected or coupled to said integrated-circuit chip.

More specifically, the invention relates to devices such as contactless chip media, contactless smart cards, cards operating in a dual contact and contactless mode (dual interface), electronic identification tags, electronic passports, devices with an antenna. The invention is in particular aimed at contactless electronic travel documents (electronic passports and electronic visas), devices with a secure electronic chip.

These devices may comply with the specifications of the ICAO (International Civil Aviation Organization) and/or ISO/IEC 14443.

Such transponder circuits particularly belong to the field of contactless smart cards or electronic passports. The antenna and the capacitor generally form a resonant circuit. The resonant circuit may be passive or active and may be connected to a radiofrequency integrated-circuit chip for communicating data with a radiofrequency reader.

Transponders with a radiofrequency chip are used in various economic fields such as banking (electronic purse), communication, transport, identity (e-passport, ID card). Particularly in identity, it is known to identify a person by radiofrequency communication with an RFID-type contactless portable electronic object.

PRIOR ART

The smart card industry is constantly seeking cost-effective solutions to manufacture and connect electrically conductive elements, such as integrated-circuit chip modules and radiofrequency antennas.

Conductive tracks or interconnection or connection pads on flexible plastics are usually produced by chemical etching of copper (subtractive method), by pad printing or by printing a conductive material on the substrate (additive method) through screen printing, flexoprinting conductive ink, inkjet or aerosol jet printing of material.

The production of antennas using various printing technologies, including additive metal printing (screen printing, electrochemical deposition) or subtractive metallization (lamination of metal film on a substrate followed by etching) is known.

For inkjet or screen printing of conductive ink, the formulation or composition of the ink is a delicate balance between a polymeric binder and metal particles as well as the solvent in the ink. The polymeric binder provides adherence to a substrate and particle cohesion. However, the polymer requires polymerization temperature and has the disadvantage of decreasing the electrical conductivity of the deposited material and of the electrically conductive metal particles.

The particles provide electrical conductivity of the elements, in particular by the following operations:
- Coalescing (or sintering) nanoparticles, (usually carried out by exposure to high temperatures, which implies that the substrate, generally a polymeric plastic, must withstand high temperatures)
- Adjusting the geometry of the metal particles (silver flakes . . . ) and the dimensions. The smaller the particles, the easier it is to coalesce. But it takes more solvent to evacuate by the temperature.
- Using metal particles that are coated to prevent oxidation and cause the agglomeration of particles, however to the detriment of conductivity Regarding the solvent, it is required to adjust the viscosity. It ranges from very low viscosity for inkjet heads to higher viscosities for screen printing.

Moreover, methods for depositing conductive material on an insulating substrate such as Fine Powder Coating (FPC) on one side and Laser Induced Forward Transfer (LIFT) on the other are known. These are methods implemented at room temperature avoiding heat transfers during or after the deposition of electrically conductive material. They allow for the use of substrates, which only support low temperatures, but are not suitable or even used in the smart card industry or for devices with a secure integrated-circuit chip.

Technical Problem

The invention proposes a less expensive method than the previous ones for manufacturing and/or connecting among others integrated-circuit smart card and/or antenna modules.

The invention proposes a simple method of execution that is easy to implement in the immediate future and offering various possible structures.

It also aims to reduce the number of manufacturing steps and to have thinner electronic inserts to be inserted in chip devices.

It aims to preserve the very good electrical conduction properties of the tracks in particular to achieve good radiofrequency properties of an antenna.

SUMMARY OF THE INVENTION

The invention provides methods for directly depositing metal at ambient temperatures or at low temperature, typically less than 100° C.

To this end, the invention relates to a method for manufacturing a device with a secure integrated-circuit chip, said device having an insulating substrate, electrically conductive surfaces on the substrate connected or coupled to said electronic chip, said electrically conductive surfaces being produced by a step of directly depositing or transferring conductive material, in particular in the form of microparticles.

The method is characterized in that said step of depositing or transferring conductive material is carried out by a technique (FPC, LIFT) of directly depositing metal microparticles onto the substrate, said deposit being obtained by coalescence of the microparticles forming at least one or several uniform cohesive layer(s) that rest(s) directly in contact with the substrate.

The formulation of the deposited material is free of polymer or solvent. The formulation of the material to be deposited only contains metal.

According to further characteristics of the method:

The conductive material is pure metal and said microparticles are metal microparticles; the purity of the metal may preferably be equal to 100%, or higher than 98% or higher than 95%

The material has properties of suitability for soldering or brazing after it has been deposited or transferred The material obtained has a crystalline structure, which is the same as that of the metal (copper, etc.)—The substrate is chosen from a smart card type continuous dielectric strip, a single-sided strip with metallizations on one side, a plastic plate, in particular made of PE, PC, ABS, comprising a plurality of metallized radiofrequency insert locations, such as on a smart card or radiofrequency electronic passport; the material of the substrate may among others be glass-epoxy, PET, polyimide, PEN, etc.

The material transfer or deposition technique is chosen from among FPC, LIFT or similar techniques It carries out the direct deposit through an M mask for the FPC technology It includes a step of producing at least one surface and/or at least one redirection track and/or at least one electrically conductive antenna on a module of single-sided type, said conductive surfaces connecting an integrated-circuit chip via a soldered wire or conductive glue It includes a step of producing at least one electrically conductive surface in a location of a plastic sheet intended to constitute the body of a smart card or an electronic passport It implements a continuous or stepwise movement of a substrate strip receiving conductive material and of a continuous masking strip to mask the receiving substrate It implements a synchronization of the stepwise movement of a substrate strip receiving conductive material and of a continuous masking strip to mask the receiving substrate It includes means for setting the relative positions of the masks with respect to the areas to be covered with conductive material The invention also relates to the device corresponding to the above method. It is characterized in that the material consists of a deposit of metal microparticles coalesced on the substrate, said deposit forming at least one or several uniform cohesive layers(s) that rest directly in contact with the substrate.

According to further characteristics of the device:

The deposition of coalesced metal microparticles is free of polymer or solvent; the coalesced metal microparticles are also free of polymer or traces of solvent inside the deposit or layer(s)

The device includes an electrical connection of the include, to with the conductive material by directly soldering or brazing onto said conductive material The invention relates to an application of the method to the production of a device with a secure integrated-circuit chip constituting a smart card module, an insert of a smart card body or a sheet of an electronic passport.

The substrate of these objects or devices carrying the layer or several metal layers is advantageously chosen from a material having a melting or softening temperature of less than 100° C.

The invention would allow the smart card industry to benefit from the following improvements:

No solvents are involved since the energy of the plasma or of the laser is used directly to transfer the material (in a liquid state)

A genuinely dense, consistent and organized layer is obtained without requiring high temperatures (allowing low temperature substrates to be used) and providing better conductivity Deposits of different or identical materials can be carried out immediately after this without intermediate drying

Methods (OMO type) for directly depositing metal on a substrate (including plastics such as ABS, PMMA, PA, polycarbonate (PC), PEEK PVC, etc.) thanks to new atmospheric plasmas or "laser-induced forward transfer" processes (LIFT) will allow for new module and antenna designs, new programs for a three-axis robot supporting the print head or a substrate carrier and/or the displacement of a laser's galvanometric mirror.

The preferred thicknesses aimed at today by the invention range from 1 to 30 μm.

The width of the line formed ranges from 10 to 500 μm. The metals available today include: Cu, Ni, Sn, Ag, Au, Sn, Al, Pd, etc.

Figure 1:
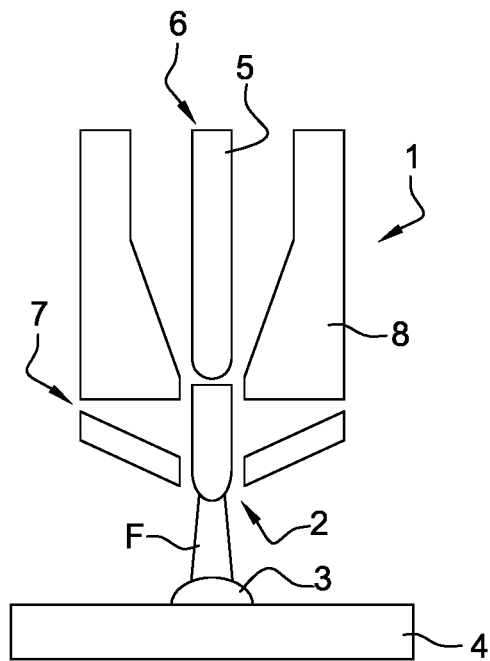
FIG. 1 shows an FPC process

FIG. 1 shows an example of an FPC-type head (fine-powder coating), used to deposit metal 3 on a substrate 4 with a metal plasma jet F. It mainly comprises a plasma generation area 2 in the lower part of the head 1, a central cathode 5 for the electric power supply to the head, an anode 8 surrounding the central anode, a gas and electricity supply 6 at the level of the cathode. A fine-powder metal microparticle feeding inlet 7 in a feed space is located in the lower part of the head 1.

Among others, the company "Plasmatreat SAS" supplies such a head and facility.

This company makes the following comments on the FPC technology referenced under the "Plasma Openair®" brand name: "Plasma serves as a safe and fast means of transporting the heated powder inside the nozzle itself. During the process, the fine powder particles are directly injected into the highly-charged plasma beam. The metal particles absorb the thermal energy of the plasma. Due to the high density of the plasma in the centre of the beam, the particles melt and bind to form the layer. The kinetic energy of the plasma beam transports the particles out of the Openair® plasma beam onto the substrate to form a homogeneous metal layer."

"Particularly in the electronics industry, FPC can be used to apply functional conductive tracks to plastic substrates—creating printed circuit boards without the need for bonding, soldering, or any other steps."

Such a facility is thus proposed by the above company to make metal deposits in various technical fields including the electronics field for printed circuit boards.

However, this process has not been provided for the specific field of smart cards. There is no indication as to how it is used, neither for which operation, nor on which product and this in an industrial manner at a high rate. This process therefore cannot be transferred directly to the smart card industry.

The targeted fields of application are also different from the general one for portable media with a secure electronic chip such as those intended among others to include (or implement) cryptographic security keys with internal cryptographic engines, authentication certificates, anti-fraud means such as anti-DPA (electronic attack scrambling, means for scrambling eavesdropping operations on the data processing in an integrated-circuit chip), diagnostics. These chip media are used in particular in secure communications, electronic transactions, banking transactions, transportation, telecommunications, loyalty, access control, payment, NFC transactions in the broad sense, personnel identification, authentication of electronic devices or remote terminals.

These media include smart cards, electronic passports, contactless radiofrequency transponders, USB keys, contactless badges, telecommunications SIM cards, USIM or other fields of the invention presented above in the introduction. The targeted devices comply with standards such as banking standards, cellular telecommunications, ICAO passport, ISO/IEC 7816, ISO/IEC 14443, EMVco, ETSI, Globalplatform.

In addition, a facility such as the one shown in FIG. 1, is neither planned nor considered for manufacturing the above products in industrial quantities.

Figure 2:
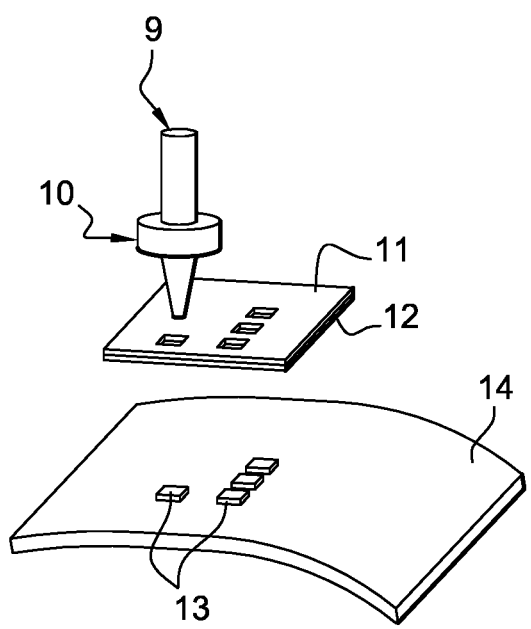
FIG. 2 shows a LIFT process

FIG. 2 shows another method of metal deposition 13 by printing on a receiving substrate 14, referred to as LIFT. It comprises means for producing a laser beam pulse 9, an element for shaping (or focusing) the laser beam, a donor metal substrate 12 supported by a thin film 11 and a transparent glass medium. The donor substrate is placed between the beam and the receiving substrate 14.

The laser-induced forward transfer (LIFT) process is a laser-assisted printing process of thin films that absorb a laser beam. It can be used to deposit organic and inorganic materials.

The principle consists in expelling a portion of material from a film of donor material to a receiving substrate through laser evaporation. Various conductive or insulating materials may be printed in this way. Several passes may be required to obtain a desired thickness of conductive material.

Figure 3:
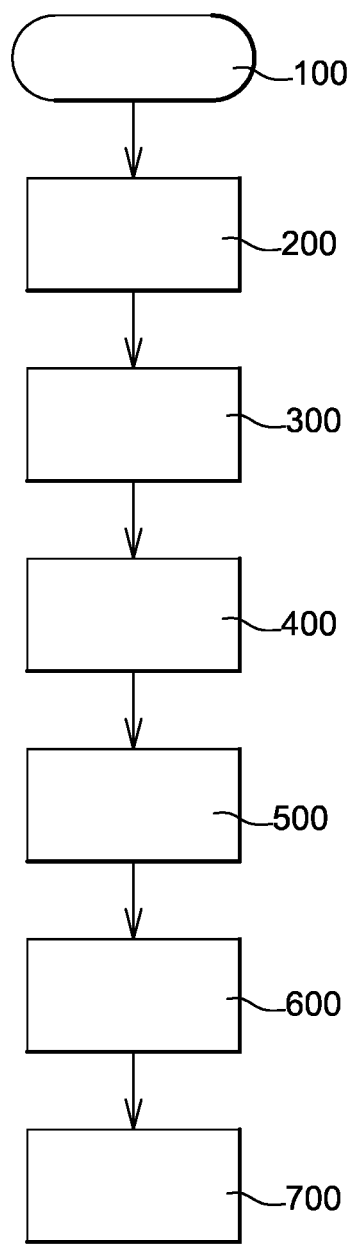
FIG. 3 shows the steps of the method according to a first embodiment

In FIG. 3, according to a preferred embodiment, the invention includes the following:

In step 100, the method comprises a step of supplying a module 4A-4E, in particular of single-sided type, comprising a dielectric substrate 24 and electrically conductive metallizations 28 on a first face. The substrate comprises holes or wells 31 facing the metallizations making the metallizations accessible through the holes from a second face of the substrate that is opposite the first face.

In step 200, the method comprises a step of cleaning and preparing at least one visible surface portion on the second face. This step consists in improving the clinging of the metal layer to be deposited. It can be carried out by those skilled in the art using any known method of surface treatment. However, the invention advantageously provides that this step be performed by the same FPC e-beam tool as the one used for the direct metal deposition process.

In step 300, metal layers 3, 13, 23, 33, 43, 53 are deposited on the previously prepared surface or target surface to be covered with a substrate 4, 24.

In step 400, a second pass may be carried out to directly deposit an additional layer of metal (without waiting for any drying operation to be carried out or any solvent to evaporate as in the prior art).

In step 500, a protective layer or an insulating or conductive coating may optionally be deposited immediately after the previous step, possibly using the same FPC method (or any other known method).

In step 600, the transfer of an electronic component (in particular of SMT type: surface-mounted or, in particular, a bare or coated integrated-circuit security chip) may be carried out on another operating station. Its electrical connection or its coupling with the surfaces or conductive tracks thus created and/or with the metallizations carried out previously on the first face of the substrate may also be carried out. The connection can be established by any known means: brazing or soldering, in particular using soldered wire or conductive glue, especially anisotropic (paste: ACP, or film: AFP).

In step 700, an optional operation aiming to at least partially protect the component or the bare integrated-circuit security chip and/or its connections may be carried out.

The thickness of the layers deposited ranges, for example, from 1 to 30 μm and the width ranges, for example, from 10 to 500 μm for tracks.

A single pass or a tool run allows for a thickness between 1 and 10 μm to be obtained with the LIFT process, whereas, with the FPC process, the thickness is inversely proportional to the sweeping speed.

Figure 4:
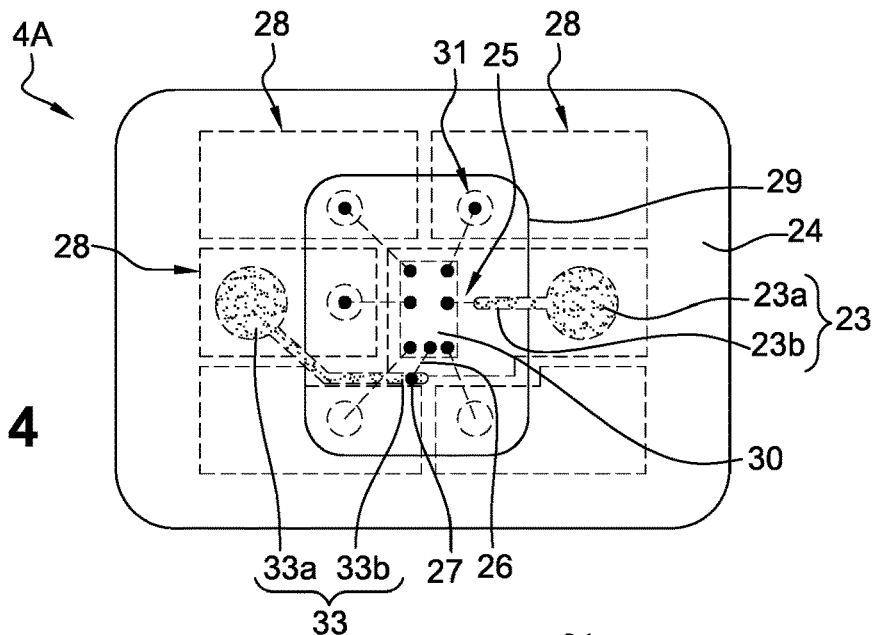
FIG. 4 shows the execution of interconnection tracks on a single-sided smart card module

In FIG. 4, we will describe a way to implement the method of the invention to manufacture a device with a secure integrated-circuit chip. The manufactured device includes (or consists of) an insulating substrate, electrically conductive surfaces on the substrate connected or coupled to said electronic chip. The electrically conductive surfaces are produced by a step of directly depositing or transferring conductive material, in particular in the form of microparticles. The deposition is carried out at room temperature or in a cold state, i.e. at temperatures below the melting point of most plastics used as a media in the smart card industry.

In the example, the device is shown in the form of a smart card integrated-circuit 4A chip module. It is of single-sided type as previously described and is provided with contact pads 28 in ISO 7816 format on a first face (not visible in the figure and opposite the first face) and with holes (or wells) 31 formed through a dielectric support film 24 for connecting the tracks to the integrated-circuit chip 30.

According to one characteristic, the method includes a material deposition or transfer step performed using a technique of directly depositing metal on the substrate, the material having properties suitable for soldering or brazing after it has been deposited or transferred.

Thus, on the second face (visible in the figure) of the substrate 24, interconnection and/or redirection pads 23a, 33a and/or tracks 23b, 33b are produced by depositing metal 23, 33 according to the FPC or LIFT method of the invention.

These tracks 23a, 33a extending from an area in the immediate vicinity of the chip for connection to the chip, to an area further away receiving the interconnection pad 23a, 33a to allow connection to an antenna (not shown) in a card body. A chip 30 is then transferred, fastened to the module, connected by soldered wires on the one hand to the contact pads through the passage wells (holes) of the connecting wires and on the other hand 25, 26 to the tracks 23b, 33b extending to the interconnection/redirection pads 23a, 33a.

The invention advantageously makes it possible to directly solder the connecting wires 25, 26 to the tracks 23b, 33b and to the pads freshly made by depositing conductive metal 23, 33. Thanks to the deposition process, the metal layer 23, 33 is of good quality, especially in terms of conductivity, metal density, mechanical strength and allows subsequent soldering.

The invention allows for very broad last-minute flexibility for designing tracks and/or conductive pads according to the chips available on the market and/or according to the of either electrical contact or hybrid modules (electrical contact with an external reader and contactless).

Since the invention uses a method of additive type, it allows for metal to only be deposited in the desired locations of the medium, which leads to metal being saved.

The tool can be controlled using a numerical control with a program that can be loaded or executed according to the desired metal deposition pattern or to a specific pattern for each module. A change of pattern may take place between any object (module) and any other on a production line, in particular for smart card modules.

Figure 5:
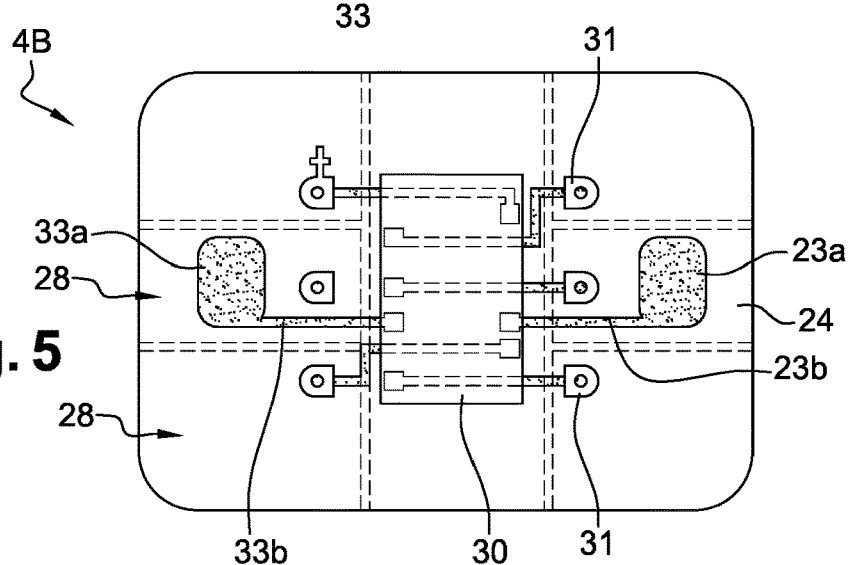
FIG. 5 shows the execution of redirection and interconnection tracks on a single-sided smart card module

In FIG. 5, a contact module 24 is provided as previously. The same numbers designate the same elements or substantially the same types of elements from one figure to the next. This embodiment differs from the previous one in that the chip 30 is transferred by being turned over (flip-chip) so that its connection pads are oriented towards the visible face of the module (in the figure).

Several redirection or interconnection tracks 23b, 33b are created on the substrate. They extend from a chip connection area, corresponding to a chip pad location to directly connect a chip pad, to one of the connection wells 31 located opposite the contact pads 28 arranged on the opposite face of the dielectric film 24.

The connection to the antenna in a smart card body requires two tracks 23b, 33b respectively extending from the location of a radiofrequency pad LA, LB of a contactless or dual or hybrid (contact and contactless) interface chip to an area of the dielectric film receiving an interconnection pad 23a, 33a to subsequently connect a radiofrequency antenna. The chip is then transferred and connected as a flip-chip, in particular using anisotropic conductive glue (e.g. of AFP or ACP type). The chip may be coated with a protective resin (not shown).

This mode is economical because it avoids the metallization of the holes previously obtained in the prior art due to electrochemical growth.

Figure 6:
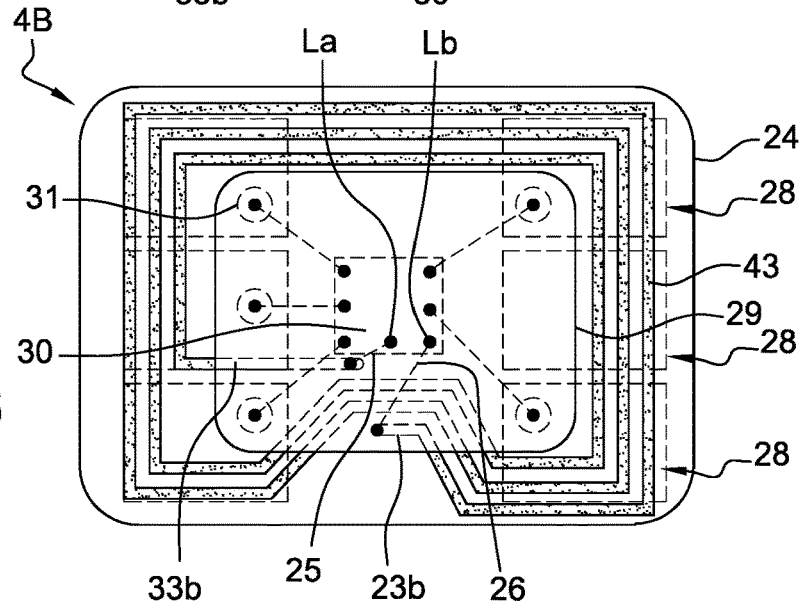
FIG. 6 shows the execution of an antenna on a single-sided smart card module

In FIG. 6, the invention makes it possible to produce an integrated-circuit chip module of antenna-module type (carrying an antenna and most often with electrical contact pads) in which, a radiofrequency antenna 43 is carried by the module itself rather than by the radiofrequency smart card body.

A module 4B is provided, which is substantially similar to module 4A in FIG. 3 except that connection tracks 23b, 33b to the radiofrequency pads LA, LB of the chip are extended by an antenna 43 which is formed according to the LIFT or FPC metal deposition method proposed by the invention. In this case, the antenna is in the form of a spiral in accordance with the ISO 14443 standard, but it could be of another type, e.g. UHF, and of another shape, in particular a dipole, and operate at another frequency.

In this case, the electrical connection of the antenna 43 to the chip 30 is carried out in a conventional manner directly through wire 25, 26 soldered to the pads La, Lb of the chip owing to the density and quality of the deposited metal. Proven conventional techniques and machines of the electric smart card industry can thus be implemented and reused to connect the chip 30.

The electrical connection of the chip 30 can be carried out as in the previous figure using a flipped chip and connecting with conductive glue, in particular anisotropic.

In FIG. 6, another way of implementing the invention provides for producing an antenna 43 or antenna elements directly on an insulating substrate 24. In this case, the substrate is in smart card body format and constitutes a radiofrequency chip card sheet or insert (or contactless inlay). Alternatively, the sheet or substrate 24 may be a subassembly of an electronic passport sheet. The sheet is subsequently laminated/assembled with other sheets to obtain the final product.

A micromodule 45 is transferred to the substrate 24, for example, by having the chip 48 and/or its coating placed in a cavity arranged in the substrate 24. Pads 46, 47 for interconnecting with the antenna are arranged on one side of the micromodule opposite the one carrying the chip. The micromodule may provide an insulating area 50 or insulating bridge to allow the passage of antenna elements on at least one of the interconnection pads 46, 47.

The antenna 43, in this case in the form of a spiral, is produced by deposition according to the FPC or LIFT technique of the invention directly onto the substrate 24 in the vicinity of the outer perimeter of the card body. The antenna passes over the insulating area 50 of the module.

If necessary, the chip is transferred by being flipped over (flip-chip) on the terminals of the antenna, which in this case are made before the micromodule is transferred onto the substrate 45.

Alternatively, the chip is placed on the substrate in a cavity (that is already existing or created by pressing the chip into the substrate), the pads of the chip being accessible on the surface of the substrate. The antenna is then made on the substrate and directly on the pads of the chip.

The LIFT or FPC method also makes it possible to produce first and second capacitor plates on one face and/or on the other face of the substrate. The method allows the first plate to be covered with an insulation of the desired thickness and to form a second plate over the insulation. The invention allows for the necessary capacitor plate to be dimensioned directly on the substrate according to the capacitance value to be obtained for a desired frequency agreement. The invention allows for the antenna and/or its tuning capacitor to be made on the substrate and to connect it either by overlapping existing tracks on the substrate or by soldering it at a later time after it has been formed.

The device thus created can receive on one or both opposite faces one or several other cover and/or decoration sheet(s) to form a smart card or a page or cover of a radiofrequency electronic passport.

Figure 8A:
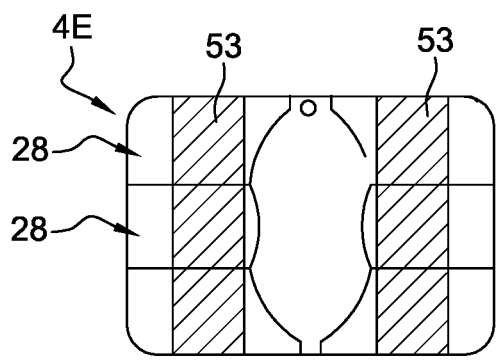
FIGS. 8A and 8B show the execution of metallizations on contact pads of a standard ISO 7816 smart card module
Figure 8B:
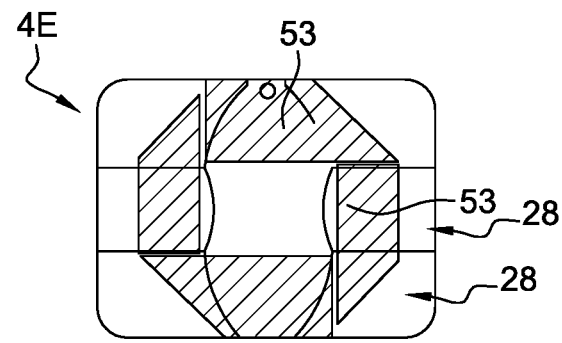

In FIGS. 8A, 8B, the invention provides for making metallizations 53 on electrical contact modules 4E next to the contact pads 28.

Figure 7:
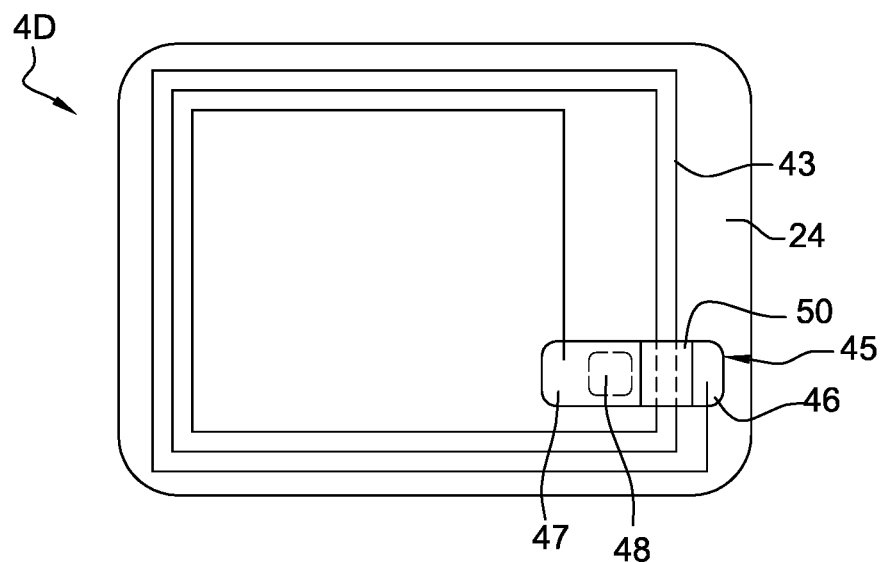
FIG. 7 shows the execution of an antenna on a smart card body

In FIG. 7A, a noble metal deposit (e.g. gold or titanium) is made at the level of the standardized areas 28 for connecting to a smart card reader having six electrical contacts. In this case, the deposition represents two parallel strips that are spaced apart.

In FIG. 7B, a noble metal deposit (e.g. gold or titanium) is made at the level of the standardized areas 28 for connecting to a smart card reader having six electrical contacts. In this case, the deposition represents a circular pattern consisting of four areas 53 forming a hexagonal pattern on the outside and a rectangle on the inside.

The invention thus has the advantage of graphically customizing a module according to a client's specific logo.

Any pattern can be made on the contact pads for purposes of decoration and/or protection/reinforcement against oxidation of certain areas of the contact module.

The above embodiments, in FIGS. 1 to 5 in particular, in connection with contact modules, may be considered on substrates having no contact pads and no connections to the contact pads. The chip may be of radiofrequency type without being a contact and contactless hybrid.

Figure 9:
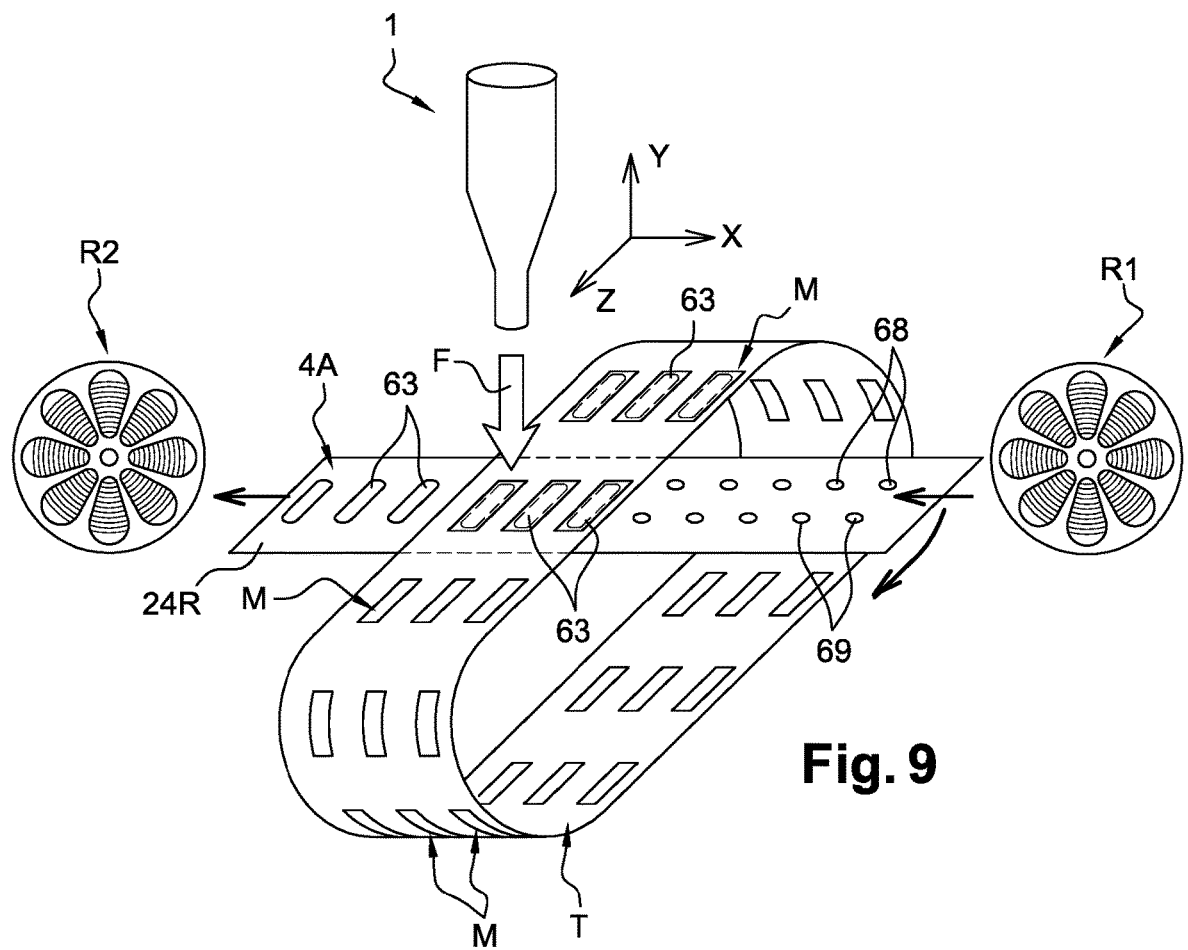
FIG. 9 shows a first embodiment of an industrial facility for producing metallizations on a chip medium aimed at by the invention

In FIG. 9, the FPC or LIFT methods are applied to the smart card. The production facility for secure electronic chip media, in particular of smart card type, comprises conveying means provided with rolls or reels R1, R2. These rolls comprise for example a dielectric strip such as the one used to obtain the modules in FIGS. 4 to 8.

The strip may already be metallized with metallizations or conductive pads 68, 69 to provide a single-sided dielectric film. The metallizations can be on the face that is visible in the figure or on the opposite face. In the latter case, the metallizations appear through wells arranged through the film or strip. This configuration of a single-sided substrate is similar to that of FIG. 4, 5 or 6, in which the wells 31 correspond to metallizations or conductive surfaces 68, 69. The metallizations 68, 69 may for example belong to contact pads 28 or other conductive surface formed on the face of the strip not visible in FIG. 9.

The dielectric strip 24R serves as a receiving substrate 4 or 14 to produce a continuous substrate 4A having a plurality of conductive depositions 63 according to the invention.

The strip 24R extends under a FPC (alternatively LIFT) print nozzle or head 1 and, for example, reels off step by step under this metal print head.

Moreover, the facility also comprises masking means in the form of a continuous strip T. This masking strip 24R has one or several opening(s), slot(s) M forming a linear pattern corresponding to the pattern to be printed or transferred onto the strip 24R. In this case, the slot M is in the shape of a rectangle so as to print an interconnection track between two electrically conductive points (or surfaces) 68 and 69 carried by the receiving strip 24R.

The continuous strip T is arranged so as to extend under the head 1 between the head and the continuous receiving substrate 24R. It is further specified that this receiver may be constituted or include a LFCC metallized strip of lead-frame type, in an application of the FPC or LIFT methods to the industrial production of smart cards. An "R2R" method (reel to reel: from reel R1 to reel R2) is preferably implemented by the invention.

The strip 24R and the strip T are synchronized during operation by means of a synchronization of the strip movement so that each slot M (in this case, a row of three slots M) is positioned opposite each point location 68 and 69 (in this case, a series of three pairs of electrically conductive points 68, 69).

When the plasma is activated, the head projects electrically conductive particles onto the continuous masking strip T, in and around the slot M. Thus, thanks to the invention, a conductive line 63 can be created continuously on the ribbon 24R through the slot or mask M of another continuous strip T.

The facility also comprises means to recover metal (not shown) deposited around the mask and, where appropriate, preferably means for cleaning (not shown) the ribbon and each slot M so as to recover substantially the same initial dimensions of the slots and reuse the strip T. These means are preferably mechanical, include brushes, wipers or scrapers, or chemical.

Alternatively, removable masks, whether disposable or not, are fastened onto the masking strip T. The masking strip T then has slots or openings M, which are wider than the slots M2 of the removable masks. The removable masks can be removed after having recovered or not having recovered the material deposited around each slot. This makes it possible to reuse the masking strip T.

If necessary, the entire strip T is replaced when the slots M are too occluded by the material deposited on them.

Figure 10:
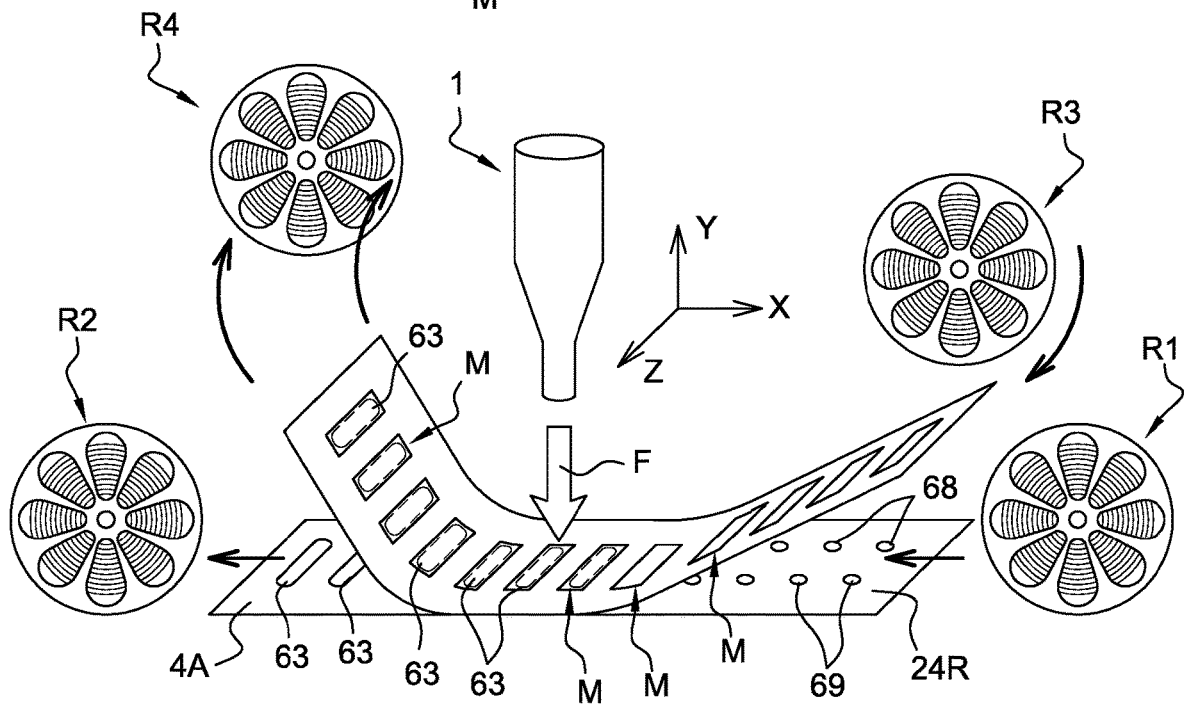
FIG. 10 shows a second embodiment of an industrial facility for producing metallizations on a chip medium aimed at by the invention New solutions to directly deposit metal elements on plastics have been developed thanks to fine-powder plasma coating (FPC) and laser-induced forward transfer (LIFT).

In FIG. 10, the facility is similar to the previous one except that the masking strip T is arranged between two reels R3, R4 placed above the reels R1, R2.

The advantage of this construction is to be able to have continuous masks that are not soiled by a previous passage under the FPC plasma print head.

Another advantage is to be able to more easily synchronize the locations of the masks in relation to the locations to be metallized. For example, strips with lateral perforations (such as cinema film strips) can be used to be able to drive and set them using a sprocket wheel. The sprockets or centring rods may simultaneously penetrate the perforations of both strips arranged facing one another.

Soiled strips are collected on the reel R4 after passing under the head and blank strips are on the reel R3 before passing under the head.

The reel can thus be treated at a later time independently of the facility in FIG. 10 to recover the excess of metal deposited around the slots M.

The slots of the strips may be identical or of several types so as to deposit different patterns on the receiving substrate.

Alternatively, the strip T may be replaced by a plate (not shown) comprising a slot or a plurality of identical slots or a plurality of different slots. The patterns corresponding to the metallizations to be transferred may be complex or composed of several different patterns.

Thus, for example, to obtain the tracks 23a, 23b, 33a, 33B, it is possible to have masks with a plurality of sets of slots corresponding to all the tracks, 23b, 33a, 33B of each module 24.

The invention makes it possible to produce three-dimensional (3D) structures by stacking the material while having good adherence to the base substrate. The inventors have found that the invention makes it possible to produce vertical columns of conductive material in certain situations (constructions), whereas with inkjet or screen printing methods, one would obtain deposits that spread out and run out over each other in identical situations (constructions).

The invention required the following adaptations among others, which are essential for the smart card industry.

For FPC, the mask is presented on a plate.

By virtue of a modification of how the transfer elements are conveyed FIGS. 9 and 10 (for FPC), the invention advantageously makes it possible to work in "Reel to Reel" mode as opposed to existing or proposed transfer facilities.

For LIFT, the donor substrates are currently made on a glass plates. It is preferable to optimize the transferred material without waste from a donor film to a receiving substrate.

The invention also includes the following other applications.

Connecting an Energy Source

A battery or supercapacitors may be connected to a flexible integrated-circuit module or to be connected to a secure integrated-circuit using these techniques.

Advantageously, the connection and the printing of a part of the conductive tracks, particularly of a flexible module, are carried out in the same operation.

At least one battery or supercapacitor connection electrode may be arranged in the same plane as the flexible module or stacked on the module. The inventors have found that to the extent that the OMO processes can print conductive steps, the electrical connection between two different planes is feasible.

Connecting a Display

In the case of a display, there is the problem of connecting an area of the display to a microprocessor controlling the various elements of the display. There may be more than 40 display elements to connect. The state of the art for connecting a display to an insulating carrier rubber tube is to use a Z-conducting ACF film and to align the tracks of the display (typically 30 to 50) with the tracks of the insulating rubber tube. Owing to the invention, the display can thus be glued onto an insulating rubber tube and conductive tracks can be "traced" directly onto the insulating rubber tube up to the connection area of the integrated-circuit chip that controls the display.

In this case, (and also in general to electrically connect at least two elements to each other), because the OMO process is a digital printing technique, it is possible to verify the placement of two separate elements (in particular by means of an optical position sensor), and connect them despite a misalignment by correcting, in real time, the deposition of conductive material forming at least one interconnection element/track. The deposition is performed on the basis of the position information of the elements to be electrically connected, received by a device for controlling the movement/positioning of the LIFT and FPC conductive material deposition heads 1 (or 9).

Customizing Contact Pads

The method according to the invention OMO can be used to carry out selective plating.

With a semi-finished product (e.g. epoxy glass+laminated Cu), the invention makes it possible to eliminate the oxide of copper and to carry out a metallization according to a specific model in one or two steps. For example, ISO contact areas that are smaller than the entire contact pads can be covered with gold.

Other Advantages of the Invention

Preparing the surface of the substrate with (plasma or laser) e-beam, modifying the surface energy using the same system that performs the metal deposition Absence of solvents Since there is no post-treatment operation, several deposition steps can be chained directly on the same machine, i.e. different thicknesses of material with the same head or different additional materials with an additional material deposition head A metal layer of very high consistency since only the metal (pure metal) is deposited without any other polymers or solvents in the deposition formula. The electrical conductivity obtained is much better.

Accordingly, the invention preferably is aimed at a method for manufacturing a device 1 with a secure integrated-circuit chip, said device having an insulating substrate 14, 24, 24R, electrically conductive surfaces 23, 33, 43, 53, 63 on the substrate that are connected or coupled to said electronic chip 30, said electrically conductive surfaces being produced by a step of directly depositing or transferring pure metal, the metal depositing or transferring step is carried using a technique of directly depositing metal microparticles onto the substrate, said deposition being obtained by coalescence of the metal microparticles forming at least one or several cohesive uniform layer(s) that rest(s) directly in contact with the substrate, the deposition technique aimed at if of FPC or LIFT type.

The numerically controlled deposition of electrically conductive (or insulating) material through LIFT or FPC makes it very easy to switch from one electric circuit pattern or model to another with the practical possibility of customizing each product distinctly from another product that comes after Owing to the invention, the method makes it possible to obtain one (or several) cohesive, dense and uniform layer(s) deposited directly on a substrate. The layer(s) thus obtained does not include or does not consist of distinct agglomerated particles having apparent porosities formed by other methods, in particular spraying.

A very high electrical conduction is obtained of a singe or multiple layer obtained in particular by coalescence of the nanoparticles in a cold state. The substrate can be chosen from among those that do not resist to high temperatures. The method can be carried out at temperatures below 100° C. The particles deposited on the substrate do not reach 100° C. The substrate does not reach 100° C. at the interface with the particles during the deposition process. The selected substrate materials can have a softening, deformation or melting temperature higher than 100° C.

Several passes of the heads over a same surface make it possible to increase the required thickness according to the applications.

The numerical process is also compatible with an online optical monitoring system to analyse and correct the placement of the various conductive elements to be deposited.

Ability to transfer metal onto a combination of pre-assembled electric and/or electronic elements or components such as several secure chip modules, a secure chip module and a battery, a battery and an antenna, by carrying out the deposition of the electrical interconnection in the same operation.

Ability to print conductive steps (or gradients) and to generate 3D shapes.

Devices sensitive to temperatures below 100° C. can be metallized in this manner (batteries).

In-house simplification of the various materials or natures of substrates, which allows one to be less dependent of suppliers.

These technologies are implemented in the open air at normal atmospheric pressure.

The methods can be implemented in reel to reel mode at high rates and more economically as shown in FIGS. 9 and 10.

The invention claimed is:

1. A method for manufacturing a device with a secure integrated-circuit chip, said device having an insulating substrate, electrically conductive surfaces on the insulating substrate electrically connected to said secure integrated-circuit chip, said electrically conductive surfaces being produced by a step of depositing or transferring conductive material, said secure integrated-circuit chip being directly soldered or brazed to the conductive material forming the electrically conductive surfaces, wherein said step of depositing or transferring conductive material is carried out by a technique of directly depositing metal microparticles, which are free of polymer or solvent, onto the insulating substrate, said deposit being obtained by coalescence of the metal microparticles forming at least one or several uniform cohesive layer(s) that rest(s) directly in contact with the insulating substrate.

2. The method of claim 1, wherein said conductive material has properties of suitability for soldering or brazing after it has been deposited or transferred.

3. The method of claim 1, wherein it includes a step of producing at least one surface and/or at least one redirection track and/or at least one electrically conductive antenna on a module of single-sided type, said electrically conductive surfaces connecting an integrated-circuit chip via a soldered wire.

4. The method of claim 1, wherein it includes a step of producing at least one surface and/or at least one redirection track and/or at least one electrically conductive antenna on a module of single-sided type, said electrically conductive surfaces connecting an integrated-circuit chip via a conductive glue.

5. The method of claim 1, wherein it includes a step of producing at least one surface in a location of a plastic sheet intended to constitute the body of a smart card or an electronic passport.

6. The method of claim 1, wherein it includes a step of depositing conductive material on metal surfaces.

7. The method of claim 1, wherein it implements a continuous movement of a substrate strip receiving conductive material and a continuous masking strip to mask the receiving substrate.

8. The method of claim 1, wherein it implements a synchronization of the stepwise movement of a substrate strip receiving conductive material and of a continuous masking strip T to mask the receiving substrate under a transfer head or laser.

9. The method of claim 1, wherein it includes means for setting relative positions of masks with respect to areas to be covered with conductive material.

10. The method of claim 1, wherein said electrically conductive surfaces define at least one conductive track or at least one antenna turn.

11. The method of claim 1, wherein said conductive material is pure metal.

12. The method of claim 11, wherein said pure metal has a purity higher than 95%.

13. The method of claim 1, wherein said technique is chosen from among Fine-Powder Coating (FPC) and Laser-Induced Forward Transfer (LIFT) techniques.

14. The method of claim 13, wherein it includes the following steps according to which direct deposition is carried out through a mask for the FPC technology.

15. A device with a secure integrated-circuit chip, said device comprising an insulating substrate, electrically conductive surfaces on the insulating substrate electrically connected to said secure integrated-circuit chip, said electrically conductive surfaces comprising conductive material, said secure integrated-circuit chip being directly soldered or brazed to the conductive material forming the electrically conductive surfaces, wherein the conductive material comprises a deposit of metal microparticles coalesced on the insulating substrate and which are free of polymer or solvent, said deposit forming at least one or several uniform cohesive layers(s) that rest directly in contact with the insulating substrate.

16. The device with a secure integrated-circuit chip of claim 15, wherein said electrically conductive surfaces define at least one conductive track or at least one antenna turn.

17. The device with a secure integrated-circuit chip of claim 15, wherein said conductive material has properties of suitability for soldering or brazing after it has been deposited or transferred.

18. The device with a secure integrated-circuit chip of claim 17, constituting a smart card module, an insert of a smart card body or a sheet of an electronic passport, said insulating substrate having a melting or softening temperature less than 100° C.

19. The device with a secure integrated-circuit chip of claim 15, wherein said conductive material is pure metal.

20. The device with a secure integrated-circuit chip of claim 19, wherein said pure metal has a purity higher than 95%.

* * * * *